United States Patent
Kloer et al.

(10) Patent No.: US 10,530,222 B2
(45) Date of Patent: Jan. 7, 2020

(54) METHOD AND APPARATUS FOR DETECTING THE POSITION OF A ROTOR IN AN ELECTRIC MACHINE

(71) Applicant: Robert Bosch GmbH, Stuttgart (DE)

(72) Inventors: Bastian Kloer, Stuttgart (DE); Daniel Rombach, Metzingen (DE)

(73) Assignee: Robert Bosch GmbH, Stuttgart (DE)

( * ) Notice: Subject to any disclaimer, the term of this patent is extended or adjusted under 35 U.S.C. 154(b) by 190 days.

(21) Appl. No.: 15/034,560

(22) PCT Filed: Oct. 27, 2014

(86) PCT No.: PCT/EP2014/073017
§ 371 (c)(1),
(2) Date: May 5, 2016

(87) PCT Pub. No.: WO2015/067497
PCT Pub. Date: May 14, 2015

(65) Prior Publication Data
US 2016/0276907 A1    Sep. 22, 2016

(30) Foreign Application Priority Data
Nov. 6, 2013 (DE) .......... 10 2013 222 534

(51) Int. Cl.
*H02K 5/22* (2006.01)
*H02K 11/215* (2016.01)
*H02K 15/14* (2006.01)
*H02K 29/08* (2006.01)

(52) U.S. Cl.
CPC ........... *H02K 11/215* (2016.01); *H02K 5/225* (2013.01); *H02K 15/14* (2013.01)

(58) Field of Classification Search
CPC ........ H02K 11/33; H02K 29/08; H02K 5/225; H02K 11/215; H02K 15/14; H05K 1/0295
USPC ............................................. 310/67 R, 68 B
See application file for complete search history.

(56) References Cited

U.S. PATENT DOCUMENTS

| | | | |
|---|---|---|---|
| 2002/0167237 A1* | 11/2002 | Horng | H02K 5/225 310/81 |
| 2003/0057781 A1* | 3/2003 | Shukuri | F04D 23/008 310/68 B |
| 2005/0212367 A1* | 9/2005 | Blase | F02M 37/08 310/68 B |

(Continued)

FOREIGN PATENT DOCUMENTS

| | | |
|---|---|---|
| CN | 201302806 Y | 9/2009 |
| DE | 103 33 822 A1 | 2/2004 |

(Continued)

OTHER PUBLICATIONS

International Search Report corresponding to PCT Application No. PCT/EP2014/073017, dated Sep. 2, 2015 (German and English language document) (5 pages).

*Primary Examiner* — John K Kim
(74) *Attorney, Agent, or Firm* — Maginot, Moore & Beck LLP

(57) ABSTRACT

An electric machine includes a stator, a rotor, a printed circuit board having at least one sensor configured to detect a position of the rotor, and a system configured to arrange the at least one sensor in different positions on the stator relative to the stator.

8 Claims, 3 Drawing Sheets

(56) References Cited

U.S. PATENT DOCUMENTS

| | | | | |
|---|---|---|---|---|
| 2007/0228261 | A1* | 10/2007 | Kang | G06F 3/0362 |
| | | | | 250/221 |
| 2008/0174212 | A1* | 7/2008 | Rudel | H02K 29/08 |
| | | | | 310/68 B |
| 2009/0261693 | A1* | 10/2009 | Debraillly | F16C 35/067 |
| | | | | 310/68 B |
| 2012/0043862 | A1* | 2/2012 | Furukawa | H02K 1/278 |
| | | | | 310/68 B |
| 2013/0039783 | A1* | 2/2013 | Wagner | H02K 1/2786 |
| | | | | 417/313 |
| 2016/0276907 | A1* | 9/2016 | Kloer | H02K 29/08 |
| 2018/0205283 | A1* | 7/2018 | Mauch | H02K 5/10 |

FOREIGN PATENT DOCUMENTS

| | | |
|---|---|---|
| DE | 1 460 747 A1 | 9/2004 |
| EP | 1 460 747 A1 | 9/2004 |
| EP | 1 662 637 A2 | 5/2006 |

* cited by examiner

METHOD AND APPARATUS FOR DETECTING THE POSITION OF A ROTOR IN AN ELECTRIC MACHINE

This application is a 35 U.S.C. § 371 National Stage Application of PCT/EP2014/073017, filed on Oct. 27, 2014, which claims the benefit of priority to Serial No. DE 10 2013 222 534.2, filed on Nov. 6, 2013 in Germany, the disclosures of which are incorporated herein by reference in their entirety.

The present disclosure relates to an electric machine having a stator and a circuit board comprising a sensor.

BACKGROUND

Electric machines are frequently fitted with sensors so as to detect a rotor position. By way of example, one or multiple sensors are placed around a shaft of a rotor of the electric machine, said sensors being used to ascertain the angle of rotation of the rotor relative to a stator of the electric machine. These sensors can be embodied in particular so as to detect the position of a transmitter wheel that is coupled to a shaft of the rotor. Magnetic measuring principles are frequently used, wherein the transmitter wheel is embodied with a magnetic ring and the sensors can be embodied as Hall sensors, GMR sensors and the like.

Furthermore, it can be provided that the sensors are arranged on a circuit board and connected in an electrically conductive manner to a control unit of the electric machine by way of conductor tracks of the circuit board.

Electrically commutated electric machines are generally controlled so that a stator magnetic field is in advance of a rotor magnetic field by a position angle of 90° of the electric rotor position. In order to achieve particular operating modes, such as for example a field-weakening mode, it can be advantageous to set a so-called pilot angle by means of which the advancement of the stator magnetic field is greater than 90°. In simple motor systems, such a greater advancement is achieved by virtue of the fact that the sensors for the position detection are arranged about the rotational axis of the shaft offset in comparison to their arrangement without a pilot angle by a defined angle so that said sensors signal a position angle that lags behind the actual position angle.

By way of example, it is possible in the case of electric machines that are designed for operating in only one direction of rotation to use a pilot angle for increasing performance with a field-weakening mode. In the case of an electric machine that is to be operated in contrast in two directions of rotation, such a pilot angle is generally not provided in order to be able to achieve an identical performance capability of the electric machine for two directions of rotation. The associated different positioning of the sensors in or on the electric machine can lead to increased production costs.

It is therefore the object of the present disclosure to render it possible to embody an electric machine in a cost-effective manner as desired with or without a pilot angle or with different pilot angles.

SUMMARY

This object is achieved by virtue of an electric machine as disclosed herein.

Further embodiments are disclosed in the dependent claims.

It is a fundamental idea of the disclosure for producing electric machines that differ only or at least also with respect to the arrangement of one or multiple sensors relative to a stator of the electric machine not to provide different circuit boards or retaining elements for the circuit boards in or on the electric machine but rather to embody said electric machine in such a manner that as required one or multiple arrangements of sensors can be selected without requiring structural changes.

Thus, an in particular electrically commutated electric machine having a stator and a circuit board that comprises at least one sensor for detecting the position of a rotor is characterized by means of a device for arranging the at least one sensor relative to the stator, wherein the device renders it possible to position the at least one sensor in different arrangements on the stator.

It can be provided in particular that the different arrangements are provided in such a manner that the at least one sensor detects the position of the rotor with different angle offsets with respect to the stator. It is thus possible as required to set a pilot angle that indicates an angle by which the stator magnetic field advances above the angle of 90° of the electrical rotor position in the direction towards the rotor magnetic field. The variation of the arrangement of the at least one sensor provides position information regarding the position of the rotor that lags behind the actual rotor position by the set pilot angle. As a consequence, it is rendered possible to produce an electrically commutated electric machine that is designed advantageously either for operating in two directions of rotation or only one direction of rotation.

In order to change the arrangement of the one or multiple sensors relative to the stator, it can be provided that fastening means are provided, said fastening means being embodied in such a manner that it is rendered possible to fix the circuit board to the stator directly or indirectly in at least two different arrangements. It is possible to provide for this purpose that the circuit board and/or the component that is connected directly to the circuit board comprises at least two alternatively useable fastening means that are arranged accordingly offset with respect to one another. It is possible when using one or multiple screw connections to perform the fixing arrangement for the circuit board to comprise by way of example multiple alternatively useable through-going openings and/or the component can comprise multiple alternatively useable threaded bore holes.

However, in addition or as an alternative thereto, it is also possible to design the position(s) of the one or multiple sensors on the circuit board in such a manner that they can be changed, for example by virtue of providing the soldering sites for contacting the sensors, (and preferably not to change the arrangement of the circuit board itself). It is possible for this purpose for the circuit board to form at least two differently arranged, alternatively useable receptacles for the (each) sensor.

The term 'receptacle' is understood to mean a position that is provided on the circuit board for the arrangement and the electrical attachment by means of conductor tracks of the circuit board. It is preferably provided that the receptacles also comprise fastening means (for example through-going openings, latching means, etc.) that render it possible to fix the respective sensor.

Furthermore, it can be provided that these differently arranged receptacles that can be used alternatively for in each case one sensor are arranged on opposite sides of the circuit board. Such an embodiment can be in particular advantageous if more than one sensor is provided and/or the size ratio of the circuit board to sensor is small. This renders it possible to populate the circuit board depending upon the provided embodiment of the electric machine (in other words in particular with or without a pilot angle or with two different pilot angles) either on the one or the other side with the one or multiple sensors and to fix said circuit board in the corresponding orientation on the stator.

Furthermore, in the case of such an embodiment of the electric machine, it can be preferred to provide that the circuit board comprises on both sides conductor tracks that are provided in particular with soldering points or fastening means so as to make contact with the respective sensor. It is particularly preferred to provide that the conductor tracks are embodied on both sides in such a manner that they connect the sensor to a control unit of the electric machine without using the conductor tracks on the other side. In particular, the conductor tracks of both sides can thus comprise identically arranged contact regions that alternatively depending upon the orientation of the circuit board that is connected to the stator contact associated contact regions of another component of the electric machine so as to connect the sensors in an electrically conductive manner to a control unit of the electric machine.

In a further preferred embodiment of the electric machine, it is possible to provide that the circuit board is fixed to a retaining element that is connected directly or indirectly to a housing of the electric machine (said housing where necessary being embodied by the stator itself) or fixed to a retaining element that comprises connecting means for connecting to a housing that surrounds the electric machine. This embodiment can have advantages with regard to the technical aspect of the production procedure in particular if the different arrangement of the one or multiple sensors is achieved by fixing the circuit board in a different position.

Furthermore, it is possible in the case of such an electric machine to provide that the retaining element is used as a (dust) protective cover for an opening of the housing and/or surrounds at least in part a component of the electric machine. It is thus possible to achieve an advantageous dual function for the retaining element.

In accordance with a further aspect of the disclosure, a method for producing the above electric machine is provided, wherein depending upon a desired pilot angle one of the different arrangements of the at least one sensor 6) is selected, wherein the device for arranging the at least one sensor is provided so that the at least one sensor is positioned in the selected arrangement.

BRIEF DESCRIPTION OF THE DRAWINGS

Embodiments are further explained hereinunder with reference to the attached drawings. The drawings are schematic views and.

DETAILED DESCRIPTION

Figure 1:
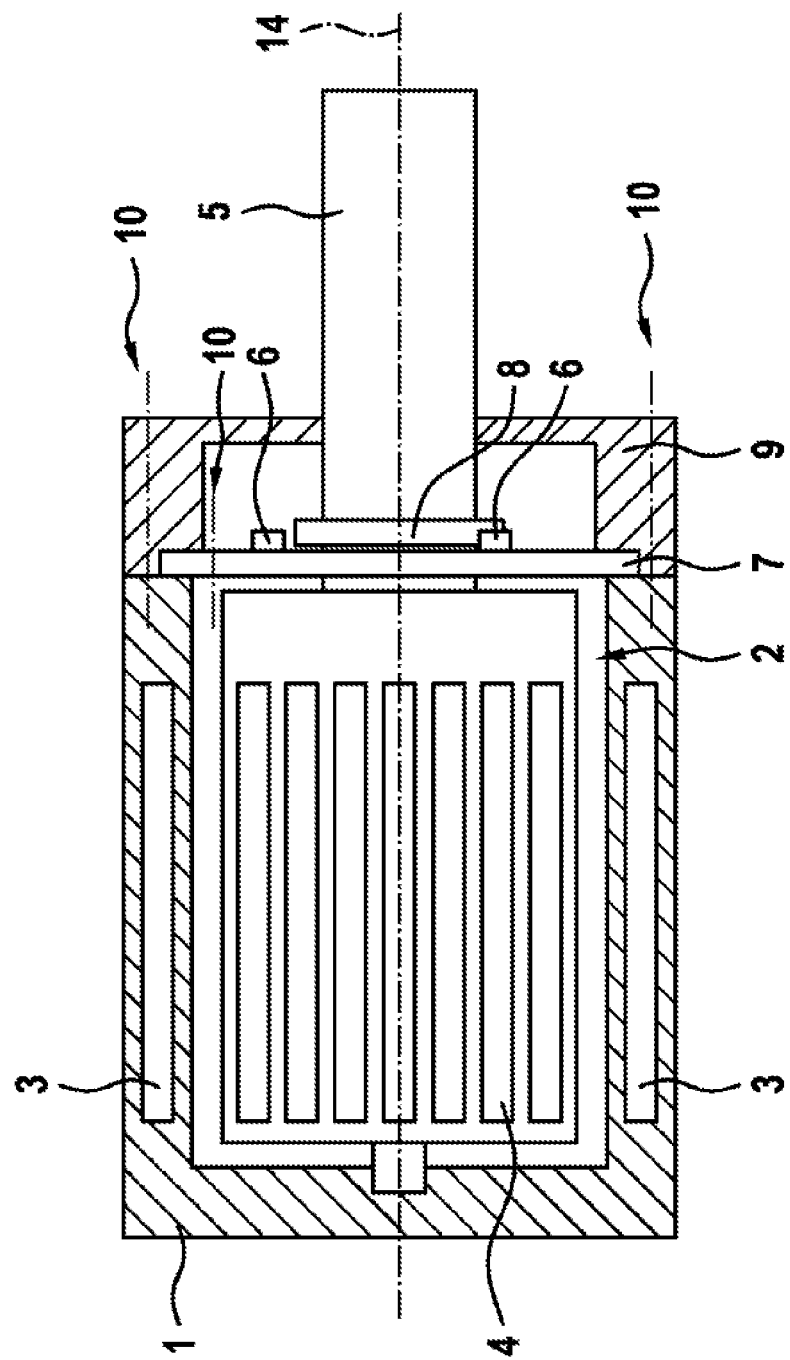
FIG. 1 illustrates a longitudinal sectional view of an electric machine in accordance with the disclosure having a circuit board populated with sensors.

FIG. 1 illustrates schematically an electrically commutated electric machine in the form of an electric motor. Said electric machine comprises a stator 1 and a rotor 2 that is rotatably mounted inside the stator 1. The stator 1 comprises stator coils 3 that can be energized by means of a control unit (not illustrated) of the electric machine so as to generate a rotating stator magnetic field.

The rotor 2 comprises permanent magnets that form rotor poles having a radially directed magnetic field. The rotor 2 comprises furthermore a shaft 5 that is mounted on both sides of the stator 1. The stator magnetic field interacts with the magnetic field that is produced by the rotor 2 so that the rotating stator magnetic field simultaneously influences the rotor 2.

The shaft 5 of the rotor 2 is guided through a circuit board 7 that is arranged on one of the longitudinal axial ends of the stator 1 and is populated with sensors 6. The sensors 6 that can be embodied as magnetic field sensors, such as for example Hall sensors, GMR sensors or the like are used for the purpose of determining the rotational position or the position of the rotor 2 relative to the stator 1. The sensors 6 evaluate a transmitter magnetic field that is generated by the transmitter wheel 8 that is arranged on the shaft 2. The transmitter wheel 8 is polarized generally in a transverse manner with respect to the axial direction, in other words the axis of rotation 14 of the rotor 2 and comprises two or multiples of two magnetic poles.

The circuit board 7 is fixed to a retaining element that is embodied in this embodiment as a protective cover 9 for the electric machine. The protective cover 9 closes the housing of the electric machine, said housing being embodied by the stator 1 at that longitudinal axial end on which the shaft 1 is guided out of said housing. The circuit board 7 is thus arranged in an inner space that is delimited by the stator 1 or by the housing and also the protective cover 9, and is consequently positioned in a manner where it is protected against environmental influences.

Screw connections 10 are used both to fix the protective cover 9 to the stator 1 and also to fix those of the circuit board 7 to the protective cover 9. The circuit board 7 comprises for this purpose two through-going openings 11 through which the screws of the associated screw connections 10 can protrude. Any alternative types of fastenings (which have a different shape, are force-fitted and/or bonded) can likewise be used. By way of example, the circuit board can be connected to the protective cover 9 by means of an (in part) lacquer coating or by using a casting compound.

The circuit board 7 forms on both sides receptacles 16 for the three sensors 6 for detecting the position of the rotor 2, wherein the receptacles 16 comprise on the one hand fastening means (not illustrated) (by way of example through-going openings so as to screw the sensors 6 to the circuit board 7, or defined fastening surfaces so as to adhere the sensors to the circuit board) for fixing the sensors 6 and the first contact regions (not illustrated) of circuit tracks 12 that are provided for producing an electrically conductive contact with associated contact regions of the sensors 6. The conductor tracks 12 terminate at defined second contact regions 13 that are provided for an electrically conductive contact with associated contact regions (not illustrated) of the protective cover 9. The protective cover 9 connects the sensors 6 in an electrically conductive manner to the control unit of the electric machine that evaluates the measurement values transmitted by the sensors 6.

The receptacles 16 on one side of the circuit board 7 (FIG. 2) differ from the receptacles 16 on the other side (FIG. 3) merely in their relative arrangement with a predetermined, selectable angle offset of by way of example approx. 15°. The three receptacles 16 on one side of the circuit board 7 (FIG. 2) are thus arranged rotated about the longitudinal axis or axis of rotation 14 of the rotor 2 by the predetermined angle offset with respect to the receptacles 16 on the other side (FIG. 3). In dependence upon the orientation with which the circuit board 7 is mounted in the electric machine, in other words which of the two sides faces the stator 1 or is remote from said stator, wherein the sensors 6 are always integrated in the receptacles 16 of the side that is remote from the circuit board 7, a corresponding angle offset can be thus set with respect to the arrangement of the stator coils 3 of the stator 1. The angle offset renders it possible to set one or two pilot angles by which the position detection by the sensors 6 is displaced.

Figure 2:
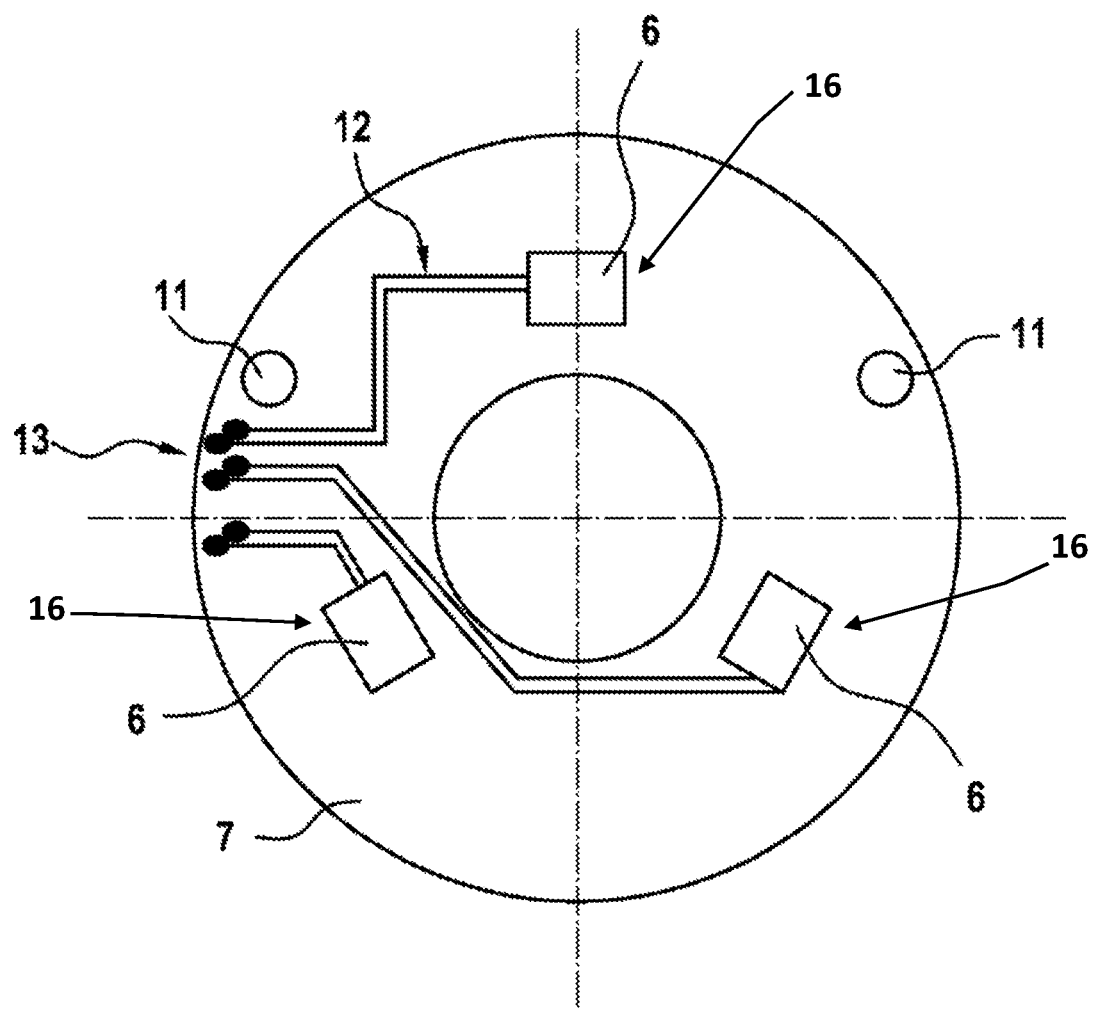
FIG. 2 illustrates the circuit board of the electric machine in a first orientation.
Figure 3:
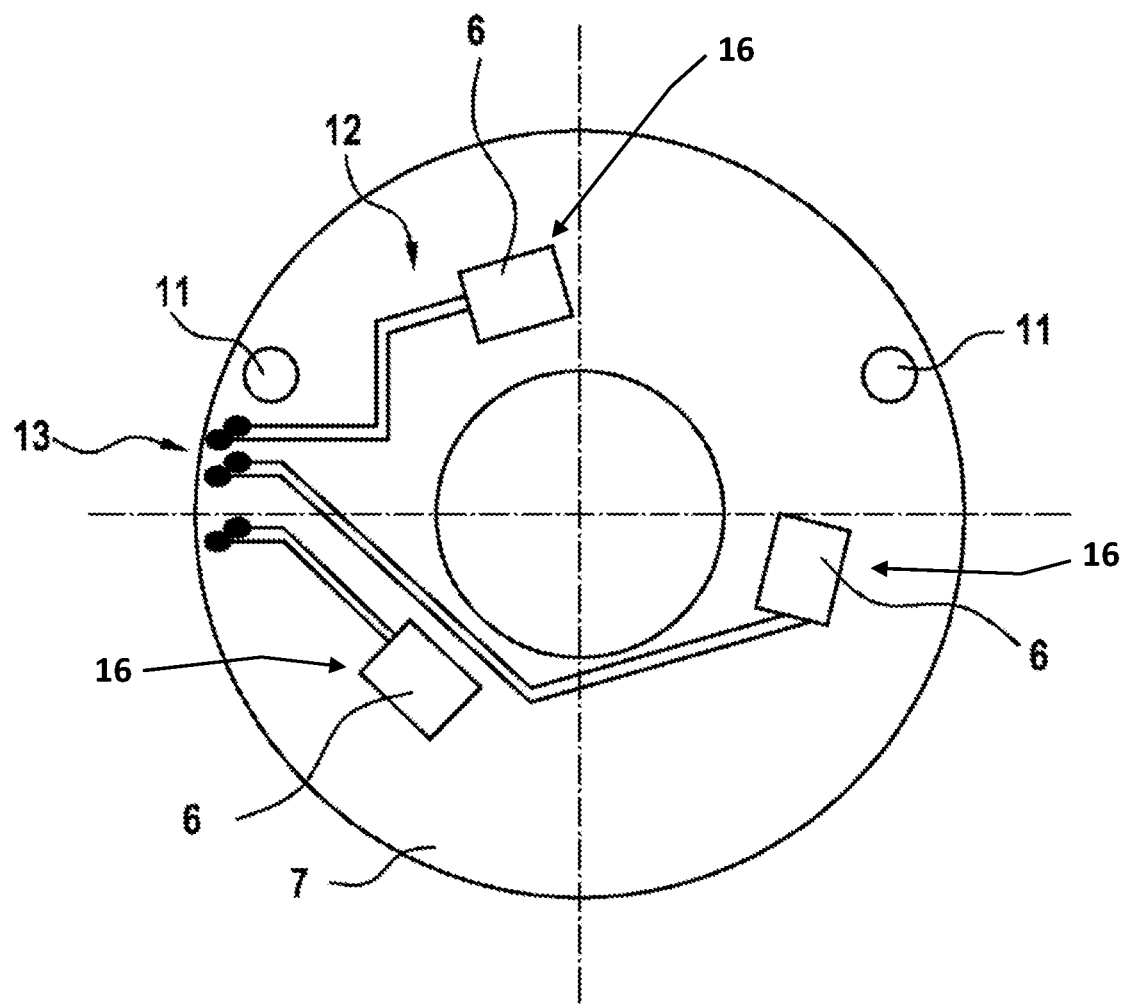
FIG. 3 illustrates the circuit board of the electric machine in a second orientation.

FIG. 2 illustrates the circuit board 7 with the sensors 6 fitted in a manner corresponding to FIG. 1, whereas FIG. 3 illustrates the sensors fitted to the other side of said circuit board. The angle offset of the sensors 6 can be clearly seen and is evident from the different arrangement of the sensors 6 relative to the through-going openings 11 and the second contact regions 13 of the circuit tracks 12 that in the case of two possible orientations of the circuit board 7 are arranged in an identical manner relative to the protective cover 9 and consequently to the stator 1.

During the procedure of producing the electric machine, it is possible, by virtue of fitting the sensors 6 on one of the two possible sides of the circuit board 7 and by virtue of installing the populated circuit board 7 in a corresponding orientated manner, to produce an electric machine that is embodied either with one, two or without a pilot angle. Moreover, this renders it possible by way of example to produce to a great extent identical electric motors of which one is designed for operating in one direction of rotation and the other one is designed for operating in two working directions of rotation or is optimized to suit a particular application. For this purpose, apart from populating the circuit board 7 in a corresponding manner, it is not necessary to make any structural changes to the electric machine. The costs for the variability that is thus achieved when designing the electric machine can therefore be kept to a minimum.

The circuit board 7 of the exemplary embodiment illustrated in FIGS. 1 to 3 is embodied in a circular manner. It is fundamentally possible for the circuit board 7 to have any shape (for example rectangular, oval, semi-circle, etc.) and also for it to be embodied from more than one part. By way of example, it is possible to provide to arrange each sensor 6 with the associated conductor tracks 12 on in each case an individual circuit board, wherein each of these individual circuit boards comprises on both sides differently arranged receptacles 16 for the associated sensor 6 and fastening means for fixing the individual circuit boards to the protective cover 9 or the housing or the stator 1 of the electric machine.

The invention claimed is:

1. An electric machine comprising:
 a stator including a plurality of stator coils;
 a rotor configured to rotate, relative to the stator, about an axis of rotation;
 a circuit board configured to be selectively mounted in different orientations relative to the stator, the circuit board including:
  a first face; and
  a second face opposite the first face along the axis of rotation; and
 at least one sensor configured to detect a position of the rotor relative to the stator, and mountable in a plurality of positions on the circuit board, wherein:
  in a first arrangement:
   the circuit board is mounted in a first orientation in which the first face faces away from the stator; and
   the at least one sensor is mounted on the first face of the circuit board at a first angle offset about the axis of rotation from a reference stator coil of the plurality of stator coils;
  in a second arrangement:
   the circuit board is mounted in a second orientation in which the first face faces toward the stator; and
   the at least one sensor is mounted on the second face of the circuit board at a second angle offset about the axis of rotation from the reference stator coil; and
  the first angle offset is different than the second angle offset.

2. The electric machine as claimed in claim 1, further comprising:
 a plurality of fastening structures configured to fix the circuit board relative to the stator in a selected orientation.

3. The electric machine as claimed in claim 1, wherein:
 the circuit board includes a first set of receptacles configured to receive the at least one sensor, and a second set of receptacles configured to receive the at least one sensor that is differently arranged relative to the first set;
 in the first arrangement, the at least one sensor is only received in the first set of receptacles; and
 in the second arrangement, the at least one sensor is only received in the second set of receptacles.

4. The electric machine as claimed in claim 3, wherein the first set of receptacles is located on the first face of the circuit board, and the second set of receptacles is located on the second face of the circuit board.

5. The electric machine as claimed in claim 4, wherein each of the opposite faces of the circuit board includes a respective conductor track configured to make electrical contact with the at least one sensor when the at least one sensor is received on the corresponding face of the circuit board.

6. The electric machine as claimed in claim 1, further comprising:
 a retaining element configured to fix the circuit board relative to the stator.

7. The electric machine as claimed in claim 6, wherein the retaining element includes a protective cover configured to at least one of close an opening of a housing of the electric machine, and surround a component of the electric machine at least in part.

8. A method for producing an electric machine, comprising:
 setting an angle offset for the electric machine, wherein the electric machine has a stator with a plurality of stator coils, the rotor is configured to rotate relative to the stator about an axis of rotation, and setting the angle offset includes:
  selecting an arrangement for a sensor configured to detect a position of the rotor relative to the stator, the arrangement selected from amongst:
   a first arrangement whereat the sensor is mounted on a first face of a circuit board at a first angle offset about the axis of rotation relative to a reference stator coil, and the circuit board is mounted so that the first face faces away from the stator; and
   a second arrangement whereat the sensor is mounted on a second face of the circuit board at a second angle offset about the axis of rotation relative to the reference stator coil, the second face is opposite the first face along the axis of rotation, the circuit board is mounted so that the first face of the circuit board faces toward the stator, and the first angle offset of the first arrangement is different than the second angle offset of the second arrangement; and positioning the sensor on the circuit board, and orienting the circuit board relative the stator, such that the sensor is in the selected arrangement.

\* \* \* \* \*